United States Patent
Chen et al.

(10) Patent No.: US 9,406,715 B2
(45) Date of Patent: Aug. 2, 2016

(54) IMAGE SENSOR DEVICE

(71) Applicant: TAIWAN SEMICONDUCTOR MANUFACTURING COMPANY, LTD., Hsinchu (TW)

(72) Inventors: Szu-Ying Chen, Toufen Township (TW); Min-Feng Kao, Chiayi (TW); Jen-Cheng Liu, Hsinchu (TW); Feng-Chi Hung, Chu-Bei (TW); Dun-Nian Yaung, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/519,798

(22) Filed: Oct. 21, 2014

(65) Prior Publication Data
US 2015/0060963 A1 Mar. 5, 2015

Related U.S. Application Data

(62) Division of application No. 13/595,494, filed on Aug. 27, 2012, now Pat. No. 8,883,544.

(60) Provisional application No. 61/642,883, filed on May 4, 2012.

(51) Int. Cl.
*H01L 27/146* (2006.01)
(52) U.S. Cl.
CPC ...... *H01L 27/14645* (2013.01); *H01L 27/1463* (2013.01); *H01L 27/1464* (2013.01); *H01L 27/14612* (2013.01); *H01L 27/14614* (2013.01); *H01L 27/14689* (2013.01)

(58) Field of Classification Search
CPC ............ H01L 27/14612; H01L 27/14614; H01L 27/1463; H01L 27/1464; H01L 27/14645; H01L 27/14689
See application file for complete search history.

(56) References Cited

U.S. PATENT DOCUMENTS

| 2003/0209712 | A1 | 11/2003 | Fujita et al. | |
|---|---|---|---|---|
| 2006/0131624 | A1* | 6/2006 | Katsuno | H01L 27/14689 257/292 |
| 2006/0270096 | A1* | 11/2006 | Brady | H01L 27/14603 438/73 |

(Continued)

FOREIGN PATENT DOCUMENTS

| JP | 2001-053260 | 2/2001 |
|---|---|---|
| JP | 2003-0258232 | 9/2003 |

(Continued)

OTHER PUBLICATIONS

Notice of Allowance dated May 29, 2014 and English translation from corresponding application No. KR 10-2013-0002965.
Office Action dated May 27, 2014 from corresponding application No. JP 2013-096213.

*Primary Examiner* — Whitney T Moore
*Assistant Examiner* — Joseph Galvin, III
(74) *Attorney, Agent, or Firm* — Eschweiler & Associates, LLC

(57) ABSTRACT

An image sensor device comprises an isolation well region within a substrate. A gate stack is over the isolation well region on the first surface of the substrate. The gate stack has an edge. A doped isolation feature is within the substrate between the isolation well region and the gate stack. The doped isolation feature surrounds an active area. The gate stack is over the active area. The doped isolation feature extends from the edge of the gate stack under the gate stack.

20 Claims, 8 Drawing Sheets

(56) References Cited

U.S. PATENT DOCUMENTS

2009/0045321 A1* 2/2009 Bae .................. H01L 27/14689
250/208.1
2011/0127592 A1 6/2011 Yanagita

FOREIGN PATENT DOCUMENTS

| JP | 2006-286933 | 10/2006 |
| JP | 2006-310650 | 11/2006 |
| JP | 2011-114302 | 6/2011 |

\* cited by examiner

US 9,406,715 B2

IMAGE SENSOR DEVICE

PRIORITY CLAIM

The present application is a divisional of U.S. application Ser. No. 13/595,494, filed Aug. 27, 2012, which claims the priority of U.S. Provisional Application No. 61/642,883, filed May 4, 2012, the disclosures of which are incorporated herein by reference in their entireties.

TECHNICAL FIELD

This disclosure relates to an image sensor device and methods of forming an image sensor device.

BACKGROUND

An image sensor device is one of the building blocks in a digital imaging system such as a digital still or video camera. An image sensor device includes a pixel array (or grid) for detecting light and recording intensity (brightness) of the detected light. The pixel array responds to the light by accumulating a charge—for example, the more light, the higher the charge. The accumulated charge is then used (for example, by other circuitry) to provide a color and brightness for use in a suitable application, such as a digital camera. One type of image sensor device is a backside illuminated (BSI) image sensor device. BSI image sensor devices are used for sensing a volume of light projected towards a backside surface of a substrate (which supports the image sensor circuitry of the BSI image sensor device). The pixel grid is located at a front side of the substrate, and the substrate is thin enough so that light projected towards the backside of the substrate can reach the pixel grid. BSI image sensor devices provide a reduced destructive interference, as compared to front-side illuminated (FSI) image sensor devices.

Integrated circuit (IC) technologies are constantly being improved. Such improvements frequently involve scaling down device geometries to achieve lower fabrication costs, higher device integration density, higher speeds, and better performance. Along with the advantages realized from reducing geometry size, improvements are being made directly to the image sensor devices.

Due to device scaling, improvements to image sensor device technology are continually being made to further improve image quality of image sensor devices. Although existing image sensor devices and methods of fabricating image sensor devices have been generally adequate for their intended purposes, as device scaling down continues, they have not been entirely satisfactory in all respects.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components are arrangements are described below to simplify the present disclosure. These are, of course, examples and are not intended to be limiting. Moreover, the formation of a first feature over a second feature in the description that follows may include embodiments in which the first and second features are formed in direct contact, and may also include embodiment in which additional features may be formed interposing the first and second features, such that the first and second features may not be in direct contact. Further still, references to relative terms such as "top", "front", "bottom", and "back" are used to provide a relative relationship between elements and are not intended to imply any absolute direction. Various features may be arbitrarily drawn in different scales for simplicity and clarity.

Figure 1:
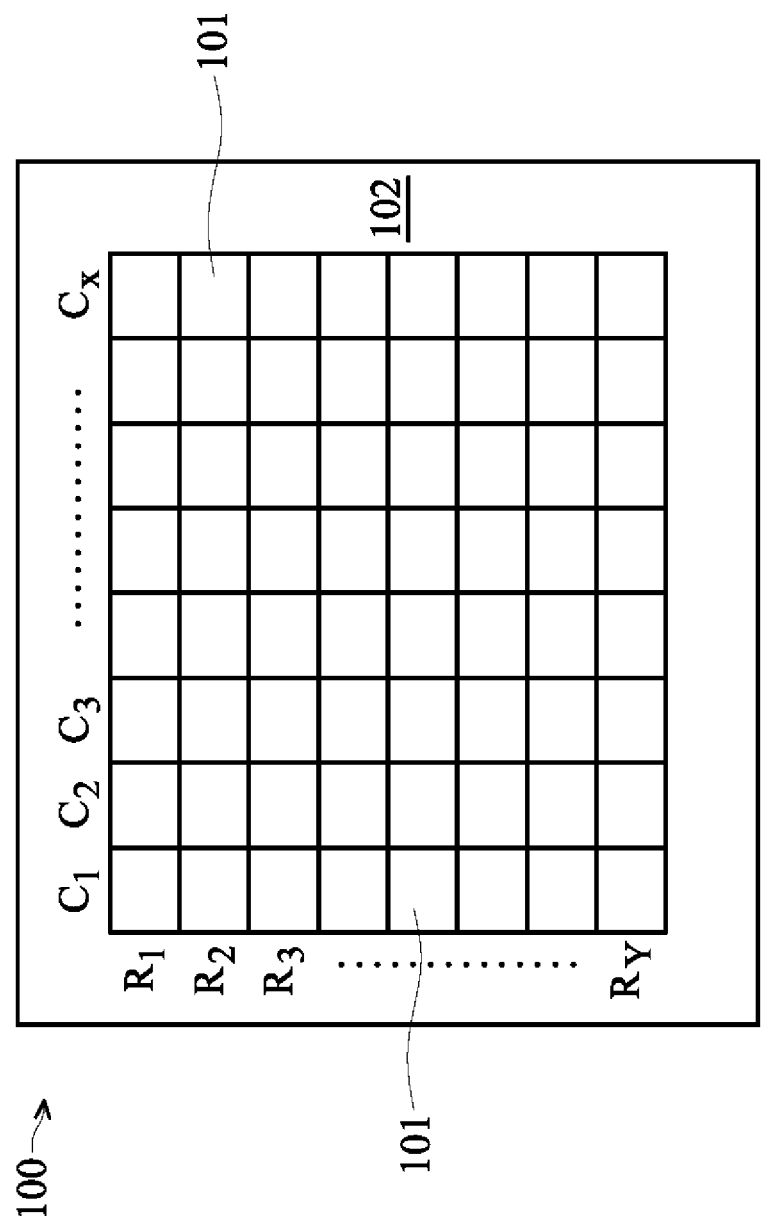
FIG. 1 is a top view of an image sensor device according to various embodiments of this disclosure.

FIG. 1 is a top view of an image sensor device 100 according to various aspects of the present disclosure. In the depicted embodiment, the image sensor device is a backside illuminated (BSI) image sensor device. The image sensor device 100 includes an array of pixel regions 101. Each pixel region 101 is arranged into a column (for example, $C_1$ to $C_x$) and a row (for example, $R_1$ to $R_y$). The term "pixel region" refers to a unit cell containing features (for example, a photodetector and various circuitry), which may include various semiconductor devices for converting electromagnetic radiation to an electrical signal. Photodetectors in the pixel regions 101 may include photodiodes, complimentary metal-oxide-semiconductor (CMOS) image sensors, charged coupling device (CCD) sensors, active sensors, passive sensors, and/or other sensors. The pixel regions 101 may be designed having various sensor types. For example, one group of pixel regions 101 may be CMOS image sensors and another group of pixel regions 101 may be passive sensors. In the depicted embodiment, each pixel region 101 may include a photodetector, such as a photogate-type photodetector, for recording an intensity or brightness of light (radiation). Each pixel region 101 may also include various semiconductor devices, such as various transistors including a transfer transistor, a reset transistor, a source-follower transistor, a select transistor, other suitable transistor, or combinations thereof. Additional circuitry, inputs, and/or outputs may be in a periphery region of the image sensor device 100. Those circuitry, inputs, and/or outputs in the periphery region are coupled to the pixel regions 101 to provide an operation environment for the pixel regions 101 and support external communications with the pixel regions 101. For simplicity, an image sensor device including a single pixel region is described in the present disclosure; however, typically an array of such pixel regions may form the image sensor device 100 illustrated in FIG. 1.

Figure 2B:
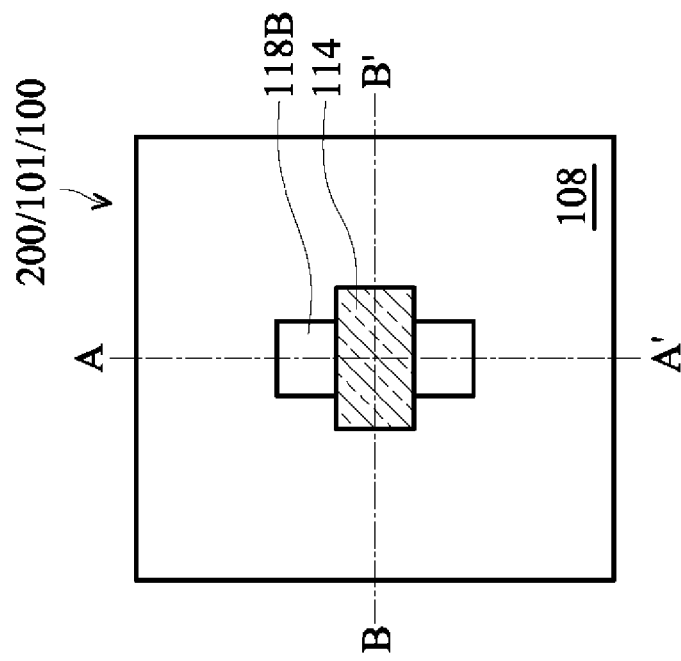
FIG. 2B is an enlarged top view of a portion of the pixel region in the image sensor device of FIG. 2A.
Figure 2A:
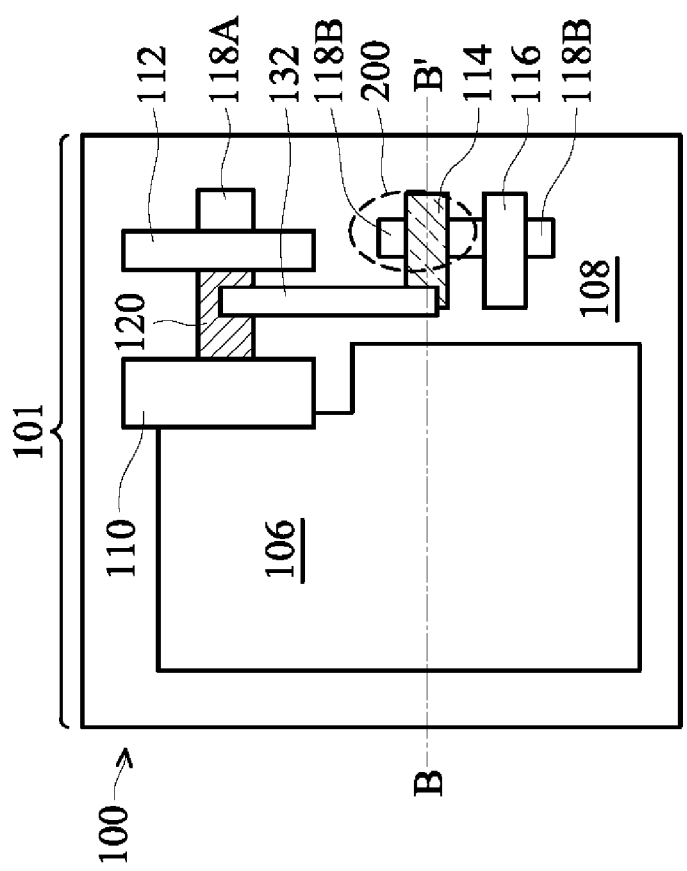
FIG. 2A is an enlarged top view of a pixel region in the image sensor device of FIG. 1.

FIG. 2A is an enlarged top view of a pixel region 101 in the image sensor device 100 on a substrate (not illustrated in FIG.

2A). The pixel region 101 refers to a unit cell containing at least one photodetector 106 and various circuitry for converting electromagnetic radiation to an electrical signal. In the depicted embodiment, the photodetector 106 includes a photodiode for recording an intensity or brightness of light (radiation). The pixel region 101 may contain various transistors including a transfer transistor 110, a reset transistor 112, a source-follower transistor 114, a select transistor 116, or other suitable transistors, or combination thereof. The pixel region 101 may also include various doped regions in the substrate, for example doped region 118A, 118B and 120. The doped regions 118A and 118B are configured as source/drain regions of previous mentioned transistors. The doped region 120 is also referred as a floating diffusion region 120. The floating diffusion region 120 is between a gate stack of the transfer transistor 110 and a gate stack of the reset transistor 112, and is one of source/drain regions for transfer transistor 110 and the reset transistor 112. A conductive feature 132 overlaps a portion of a gate stack of the source-follower transistor 114 and connects to the floating diffusion region 120. The image sensor device 100 also includes various isolation features (for example, doped isolation feature 108 in FIG. 2A and dielectric isolation feature 126 in FIG. 2C) formed in the substrate to isolate various regions of the substrate to prevent leakage currents between various regions. In the depicted embodiment, a doped isolation feature 108 is formed in the pixel region 101 to isolate the photodetector 106, the transfer transistor 110, the reset transistor 112, the source-follower transistor 114 and the select transistor 116. FIG. 2B illustrates an enlarged top view of a portion 200 of the pixel region 101. A corresponding gate stack of the source-follower transistor 114 is disposed on the pixel region 101. The doped regions 118B configured as source/drain regions are disposed adjacent the gate stack of the source-follower transistor 114. The doped isolation feature 108 surrounds the doped regions 118B and the gate stack of the source-follower transistor 114.

Figure 2C:
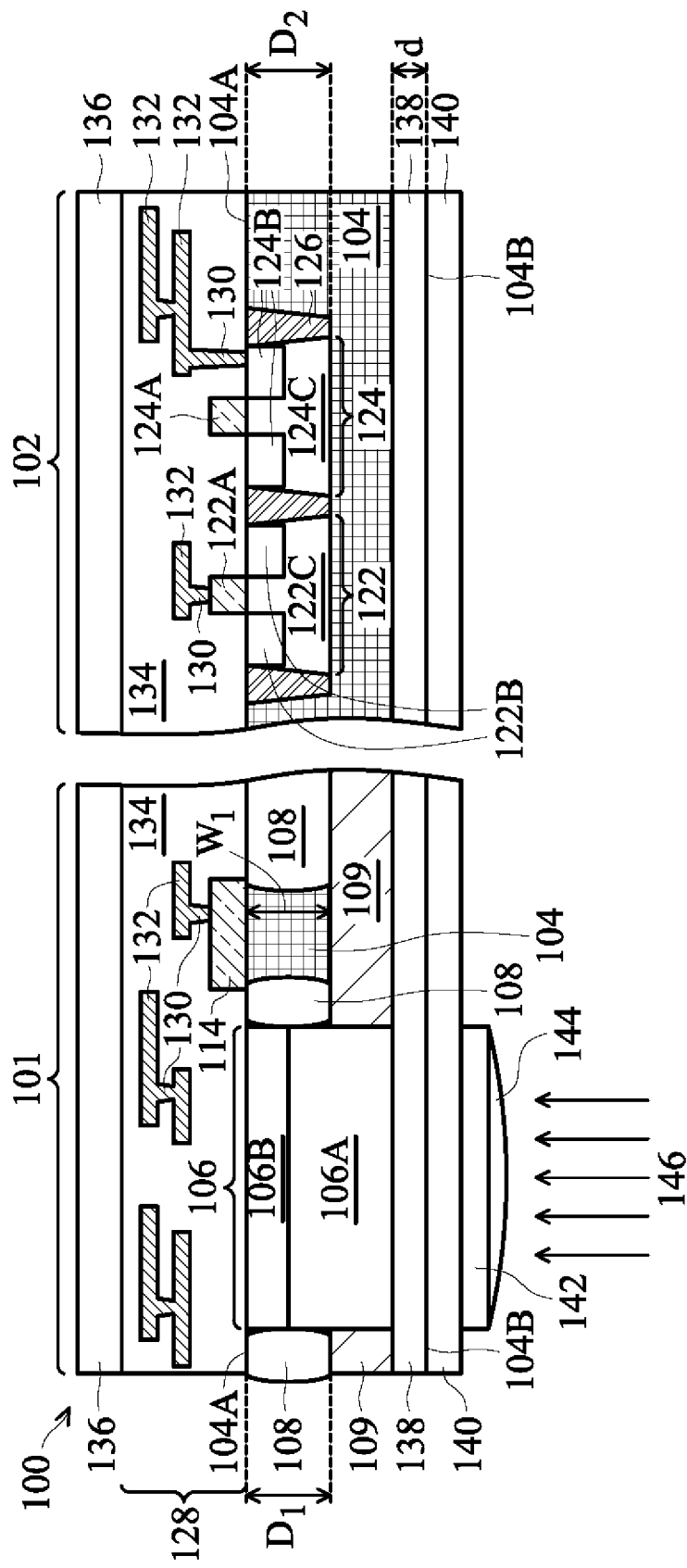
FIG. 2C is a cross sectional view of the pixel region along line B-B' in FIG. 2A and a periphery region of the image sensor device according to one or more embodiments of this disclosure.

FIG. 2C is a cross sectional view of the pixel region 101 along line B-B' in FIG. 2A and a periphery region 102 of the image sensor device 100. The image sensor device 100 includes a substrate 104 having a front surface 104A and a back surface 104B. In the depicted embodiment, the substrate 104 is a semiconductor substrate including silicon. Alternatively or additionally, the substrate 104 includes another elementary semiconductor, such as germanium and/or diamond; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 104 may be a semiconductor on insulator (SOI). The substrate 104 may have various doping configurations depending on design requirements (e.g., p-type substrate or n-type substrate). In some embodiments, the p-type refers to making holes as majority charge carriers in a semiconductor material, and the n-type refers to making electrons as majority charge carriers in a semiconductor material. In the depicted embodiment, the substrate 104 is a p-type substrate. P-type dopants that the substrate 104 is doped with include boron, gallium, indium, other suitable p-type dopants, or combinations thereof.

The pixel region 101 includes at least one photodetector 106, such as a photodiode, that includes a light-sensing region 106A and a pinned layer 106B. The light-sensing region 106A is a doped region having a first conductivity type of dopants formed in the substrate 104, specifically along the front surface 104A of the substrate 104. In the depicted embodiment, the light-sensing region 106A is an n-type doped region. The pinned layer 106B is a doped layer overlapping the light-sensing region 106A at the front surface 104A of the substrate 104. The pinned layer 106 has a conductivity type of dopants opposite to the light-sensing region 106A. In the depicted embodiment, the pinned layer 106B is a p-type implanted layer.

The pixel region 101 further includes various transistors, such as the transfer transistor 110 (shown in FIG. 2A), the reset transistor 112 (shown in FIG. 2A), the source-follower transistor 114 and the select transistor 116 (shown in FIG. 2A). Each transistor has a corresponding gate stack disposed over the front surface 104A of the substrate 104. In the depicted embodiment, the gate stack of the source-follower transistor 114 overlies an isolation well region 109. A top surface of the isolation well region 109 is away from the front surface 104A with a distance $W_1$. The distance $W_1$ is in a range from about 1000 Å to about 3000 Å. A bottom surface of the isolation well region 109 extends further into the substrate 104 toward the back surface 104B. The isolation well region 109 has a second conductivity type opposite to the first conductivity type of the light-sensing region 106A. In the depicted embodiment, the isolation well region 109 is a p-type doped region. A dosage used for the isolation well region 109 is from about $1\times10^{11}$ to $3\times10^{11}$ atoms/cm$^3$. The isolation well region 109 surrounds the light-sensing region 106A of photodetector 106. The gate stack of each transistor includes a gate dielectric layer and a gate electrode layer. The gate dielectric layer includes a dielectric material, such as silicon oxide, a high dielectric constant (high-k) dielectric material, other dielectric material, or combinations thereof. Examples of high-k dielectric material include $HfO_2$, HfSiO, HfSiON, HfTaO, HfSiO, HfZrO, zirconium oxide, aluminum oxide, hafnium dioxide-alumina ($HfO_2$—$Al_2O_3$) alloy or combinations thereof. The gate electrode layer includes polysilicon and/or a metal including Al, Cu, Ti, Ta, W, Mo, TaN, NiSi, CoSi, TiN, WN, TiAl, TiAlN, TaCN, TaC, TaSiN or combinations thereof.

The periphery region 102 may include readout circuitry and/or control circuitry coupled to the pixel region 101 to provide an operation environment for the pixel region 101. In the depicted embodiment, a PMOS transistor 122 and a NMOS transistor 124 are shown. The PMOS transistor 122 includes a gate stack 122A and source/drain regions 122B having p-type conductivity formed in an n-type well 122C. The NMOS transistor 124 includes a gate stack 124A and source/drain regions 124B having n-type conductivity formed in a p-type well 124C.

The image sensor device 100 further includes a plurality of doped isolation features 108 formed in substrate 104 of the pixel region 101 and a plurality of dielectric isolation features 126 formed in substrate 104 of the periphery region 102. The doped isolation features 108 and the dielectric isolation features 126 isolate various regions of the substrate 104 to prevent leakage currents between various regions. In the depicted embodiment, the doped isolation features 108 and the dielectric isolation features 126 isolate the PMOS transistor 122 and the NMOS transistor 124, the photodetector 106, the transfer transistor 110 (shown in FIG. 2A), the reset transistor 112 (shown in FIG. 2A), the source-follower transistor 114 and the select transistor 116 (shown in FIG. 2A).

Each of the doped isolation features 108 has a depth $D_1$ extending form the front surface 104A into the substrate 104. The depth $D_1$ is in a range from about 1000 Å to about 3000 Å. The doped isolation feature 108 has the second conductivity type as the isolation well region 109. The depth $D_1$ of doped isolation features 108 is substantially equal to the distance $W_1$ of the isolation well region 109 to the front surface 104A of the substrate 104. The doped isolation features 108 and the isolation well regions 109 surround the light-sensing region 106A of the photodetector 106 to prevent horizontal leakage paths between the photodetector 106 and other regions. In the depicted embodiment, doped isolation feature 108 is a p-type doped region. P-type dopants of the doped isolation feature 108 include boron (B), $BF_2$, gallium, indium, other suitable p-type dopants or combination thereof. A dosage used for the dopants is about from about $2 \times 10^{12}$ to about $8 \times 10^{12}$ atoms/cm$^3$. Alternatively, when the isolation well region 109 is an n-type doped region, doped isolation feature 108 is also an n-type doped region. N-type dopants of the doped isolation feature 108 include phosphorus, arsenic, other suitable n-type dopants or combination thereof.

The dielectric isolation features 126 include silicon oxide, silicon nitride, silicon oxynitride, other insulating material, or combination thereof. Each of the dielectric isolation features 126 has a depth $D_2$ extending form the front surface 104A into the substrate 104. The depth $D_2$ is in a range of about 2000 Å to about 3000 Å. The formation of dielectric isolation features 126 may include a photolithography process, an etching process to etch a trench from the front surface 104A into the substrate 104 and a deposition process to fill the trench (for example, by using a chemical vapor deposition process) with dielectric material.

The image sensor device 100 further includes a multilayer interconnect (MLI) 128 disposed over the front surface 104A of the substrate 104, including over the photodetector 106. The MLI 128 is coupled to various components of the image sensor device 100, for example the photodetector 106, such that the various components of the image sensor device 100 are operable to properly respond to illuminated light (imaging radiation). The MLI 128 includes various conductive features 130 and 132, which may be vertical interconnects 130, such as contacts and/or vias 130, and horizontal interconnects 132, such as lines 132. The various conductive features 130 and 132 include conductive materials, such as aluminum, aluminum/silicon/copper alloy, titanium, titanium nitride, tungsten, polysilicon, metal silicide, or combinations thereof.

The various conductive features 130 and 132 of the MLI 128 are interposed in an interlayer dielectric (ILD) layer 134. The ILD layer 134 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, BLACK DIAMOND® (Applied Materials of Santa Clara, Calif.), amorphous fluorinated carbon, high dielectric constant (low-k) dielectric material, polyimide, or combinations thereof. The ILD layer 134 may have a multilayer structure.

A carrier wafer 136 is disposed over the front surface 104A of the substrate 104. In the depicted embodiment, the carrier wafer 136 is bonded to the MLI 128. The carrier wafer 136 includes silicon or glass. The carrier wafer 136 can provide protection for the various features (such as the photodetector 106) formed on the front surface 104A of the substrate 104, and can also provide mechanical strength and support for processing the back surface 104B of the substrate 104.

The image sensor device 100 further includes a doped layer 138 disposed at the back surface 104B of the substrate 104. The doped layer 138 is formed by an implantation process, diffusion process, annealing process or combinations thereof. In the depicted embodiment, the doped layer 138 includes p-type (second conductivity type) dopants, such as boron, gallium, indium or combinations thereof. The doped layer 138 has a dopant depth, d, that extends into the substrate 104 from the back surface 104B of the substrate 104. The dopant depth, dopant concentration, dopant profile, or combination thereof of the doped layer 138 may be selected to optimize image quality by increasing quantum efficiency, reducing dark current or reducing white pixel defects.

The image sensor device 100 may further include an antireflective layer 140, a color filter 142 and a lens 144 disposed over the back surface 104B of the substrate 104. The antireflective layer 140 includes a dielectric material, such as silicon nitride or silicon oxynitride.

The color filter 142 is disposed over the antireflective layer 140, and is aligned with the light-sensing region 106A of the photodetector 106. The color filter 142 is designed to filter out visible light out of a predetermined wavelength. For example, the color filter 142 may filter out visible light except the light of a red wavelength, a green wavelength, or a blue wavelength to the photodetector 106. In an example, the color filter 142 includes a dye-based (or pigment-based) polymer for filtering out a specific frequency band (for example, a desired wavelength of light).

The lens 144 is disposed over the color filter 142 and is also aligned with the light-sensing region 106A of the photodetector 106. The lens 144 may be in various positional arrangements with the photodetector 106 and color filter 142, such that the lens 144 focuses an incident radiation 146 on the light-sensing region 106A of the photodetector 106. Alternatively, the position of the color filter layer 142 and the lens 144 may be reversed, such that the lens 144 is disposed between the antireflective layer 140 and color filter 142.

In an operation of the image sensor device 100 according to one or more embodiments, the image sensor device 100 is designed to receive a radiation 146 traveling towards the back surface 104B of the substrate 104. The lens 144 directs the incident radiation 146 to the color filter 142. The incident radiation 146 then passes from the color filter 142 through the antireflective layer 140 to the substrate 104 and corresponding photodetector 106, specifically to light-sensing region 106A. When exposed to the incident radiation 146, the photodetector 106 responds to the incident radiation 146 by accumulating charges. Referring back to FIG. 2A, the charges are transferred from the photodetector 106 to the floating diffusion region 120 when the gate of transfer transistor 110 is turned on. Through the connection of the conductive feature 132 (shown in FIG. 2A), the source-follower transistor 114 may convert the charges from the floating diffusion region 120 to voltage signals. The select transistor 116 may allow a single row of the pixel array to be read by read-out electronics. The reset transistor 112 acts as a switch to reset the floating diffusion region 120. When the reset transistor 112 is turned on, the floating diffusion region 120 is effectively connected to a power supply clearing all accumulated charges.

Figure 3:
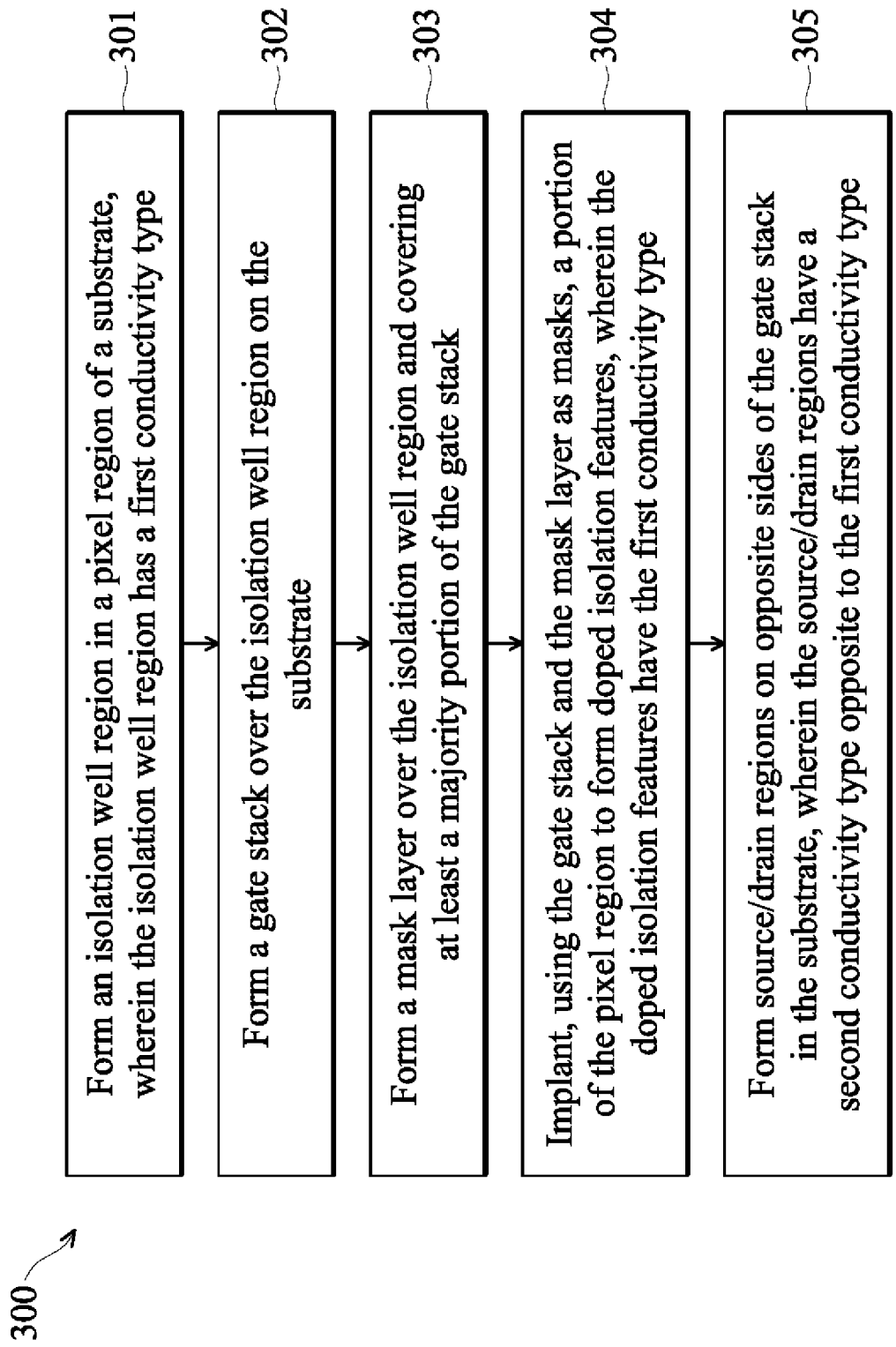
FIG. 3 is a flowchart of a method of forming an image sensor device according to one or more embodiments of this disclosure.

FIG. 3 is a flowchart of a method 300 of forming an image sensor device according to one or more embodiments of this disclosure. The flowchart of the method 300, at operation 301, a substrate has a pixel region. An isolation well region is formed in the pixel region. The isolation well region has a first conductivity type. In the depicted embodiment, the first conductivity type is a p-type polarity. Alternatively, the first conductivity type is an n-type polarity. In one embodiment, the isolation well region is away form a front surface of the substrate with a distance $W_1$. The distance $W_1$ is in a range from about 1000 Å to about 3000 Å. Next, the method 300 continues with operation 302 in which a gate stack is formed over the isolation well region on the substrate. The method 300 continues with operation 303 in which a mask layer is formed over the isolation well region and covering at least a majority portion of the gate stack. The method 300 continues with operation 304 in which the gate stack and the mask layer are used as masks to implant a portion of the pixel to form doped isolation features. The doped isolation features have the first conductivity type. In the depicted embodiment, the first conductivity type is a p-type polarity. Alternatively, the first conductivity type is an n-type polarity. The method 300 continues with operation 305 in which source/drain regions are formed on opposite sides of the gate stack in the substrate. The source/drain regions have a second conductivity type opposite to the first conductivity type. In the depicted embodiment, the second conductivity type is an n-type polarity. Alternatively, the second conductivity type is a p-type polarity. Further, it is understood that additional steps can be provided before, during, and after the method 300.

FIGS. 4A to 7B are top views and cross-sectional views of the portion 200 of the pixel region 101 in image sensor device 100 at various stages of manufacture according to various embodiments of the method of FIG. 3. Various figures have been simplified for a better understanding of the inventive concepts of the preset disclosure.

Referring back to FIG. 3, the method 300 proceeds from operation 301 and continues to operation 302.

Figure 4B:
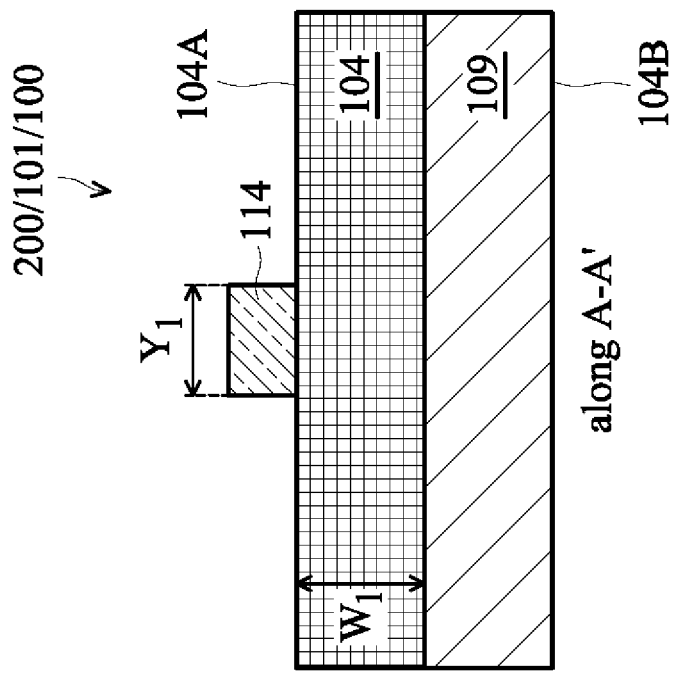
FIGS. 4A to 7B are top views and cross-sectional views of a portion of the pixel region of the image sensor device in FIG. 2A at various stages of manufacture according to various embodiments of the method of FIG. 3.
Figure 4A:
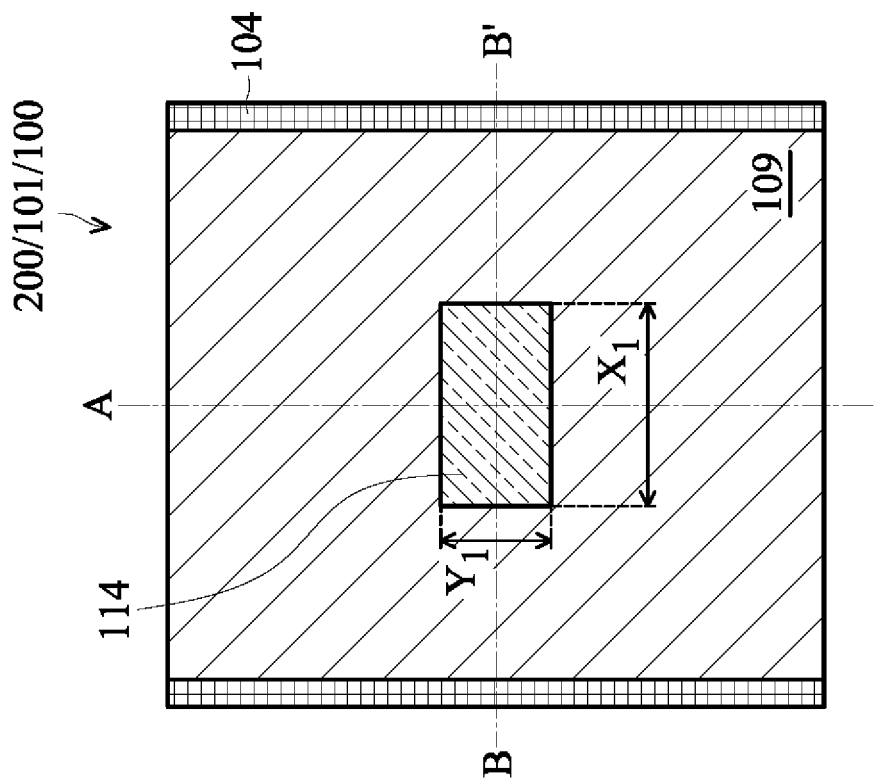

FIG. 4A is a top view of the portion 200 of the pixel region 101 after performing operations 301 and 302. FIG. 4B is a cross sectional view of the portion 200 along line A-A' in FIG. 4A. A substrate 104 has a front surface 104A and a back surface 104B. The front surface 104A is defined by a first axis (along line B-B') and a second axis (along line A-A') that is perpendicular to the first axis. The substrate 104 is a semiconductor substrate including silicon. In the depicted embodiment, the substrate 104 is a p-type silicon substrate. P-type dopants that the substrate 104 is doped with include boron, gallium, indium, other suitable p-type dopants, or combinations thereof. Alternatively, the substrate 104 includes suitable materials mentioned in the previous paragraphs.

An isolation well region 109 having a first conductivity type is formed in the pixel region 101. The isolation well region 109 is beneath the front surface 104A of the substrate with a distance $W_1$. The distance $W_1$ is in a range from about 1000 Å to about 3000 Å. A bottom surface of the isolation well region 109 extends into the substrate 104 toward the back surface 104B. The isolation well region 109 is formed by lithography patterning and implantation process. In the depicted embodiment, the isolation well region 109 is a p-type doped region. P-type dopants of the isolation well region 109 include as boron, gallium, indium or combinations thereof. A dosage used for the dopants is from about $1 \times 10^{11}$ atoms/cm$^3$ to about $3 \times 10^{11}$ atoms/cm$^3$. Alternatively, the isolation well region 109 is an n-type doped region including n-type dopants such as phosphorus, arsenic, other suitable n-type dopants or combination thereof.

Next, a gate stack is formed over the isolation well region 109 and on the front surface 104A of the substrate 104. In the depicted embodiment, the gate stack of the source-follower transistor 114 is shown for illustration purpose. The gate stack of the source-follower transistor 114 is also referred to as the gate stack 114. The gate stack 114 has a length $X_1$ along the first axis (along line B-B') and a length $Y_1$ along the second axis (along line A-A'). The gate stack 114 is formed within the isolation well region 109. The length $Y_1$ of the gate stack 114 is defined as a channel length of the source-follower transistor 114. The gate stack 114 are formed by suitable process, including deposition, lithography patterning and etching processes. The gate stack 114 includes a gate dielectric layer and a gate electrode layer. The gate dielectric layer includes a dielectric material, such as silicon oxide, a high-k dielectric material, other dielectric material, or combinations thereof. Examples of high-k dielectric material include HfO$_2$, HfSiO, HfSiON, HfTaO, HfSiO, HfZrO, zirconium oxide, aluminum oxide, hafnium dioxide-alumina (HfO$_2$—Al$_2$O$_3$) alloy or combinations thereof. The gate electrode layer includes polysilicon and/or a metal including Al, Cu, Ti, Ta, W, Mo, TaN, NiSi, CoSi, TiN, WN, TiAl, TiAlN, TaCN, TaC, TaSiN or combinations thereof.

Referring back to FIG. 3, the method 300 continues with operation 303. A mask layer is formed over the isolation well region and covers at least a majority portion of the gate stack.

Figure 5:
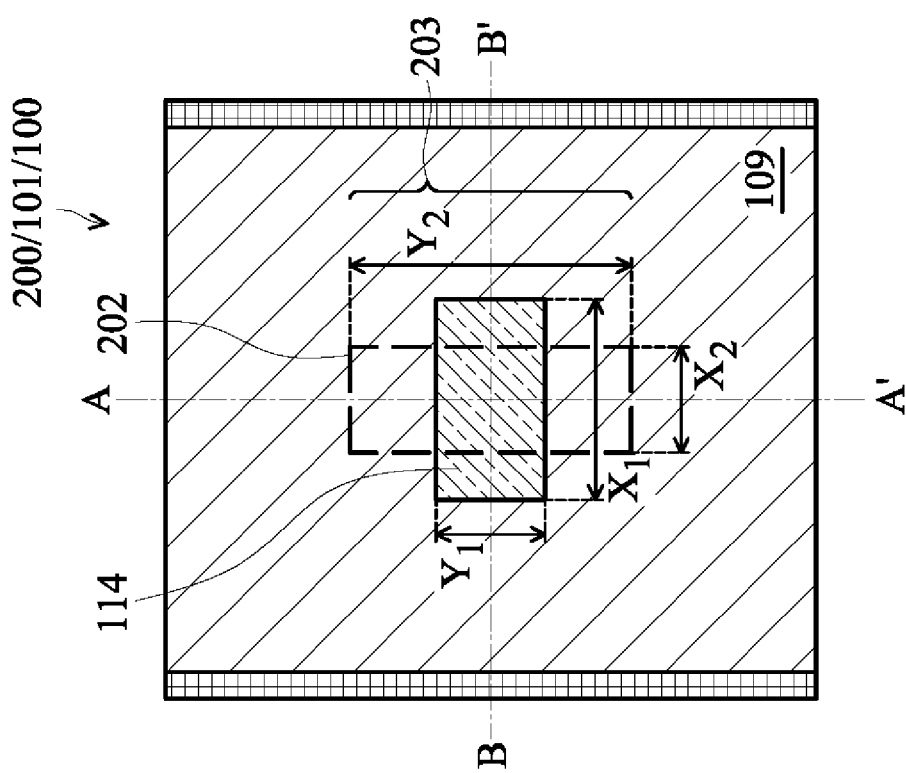

FIG. 5 is a top view of the portion 200 of the pixel region 101 after performing operation 303. A mask layer 202 (shown in dashed line) is formed over the isolation well region 109 and covering at least a majority portion of the gate stack 114. The mask layer 202 is configured to define an active area 203 of the source-follower transistor 114. Source/drain regions (shown as 118B in FIG. 7A) of the source-follower transistor 114 could be formed within the active area 203 in the following processes. The active area 203 covered by the mask layer 203 has a length $X_2$ along the first axis (along line B-B') and a length $Y_2$ along the second axis (along line A-A'). The length $X_2$ of the active area 203 is defined as a channel width of the source-follower transistor 114. The length $X_2$ of the active area 203 is no longer than the length $X_1$ of the gate stack 114 along the first axis (along line B-B'). The subsequently formed source/drain regions (shown as 118B in FIG. 7A) are confined with the active area 203. In one embodiment, the entire gate stack 114 is covered by the mask layer 202 and edges of the mask layer 202 are substantially aligned with edges of the gate stack 114 along the first axis (along line B-B'). In another embodiment, a minority portion of the gate stack 114 is not covered by the mask 202 along the first axis (along line B-B') as shown in FIG. 5. The mask layer 202 is formed by lithography patterning processes to define a feature over the isolation well region 109 and the gate stack 114. The lithography patterning processes include photoresist coating, soft baking, mask aligning, exposure, post-exposure baking, developing the photoresist, rising, drying (e.g., hard baking) or combination thereof.

Referring back to FIG. 3, the method 300 continues with operation 304. The gate stack and the mask layer are used as masks to implant a portion of the pixel region to form doped isolation features. The doped isolation features have the first conductivity type as the isolation well region. In the depicted embodiment, the first conductivity type is a p-type polarity. Alternatively, the first conductivity type is an n-type polarity.

Figure 6A:
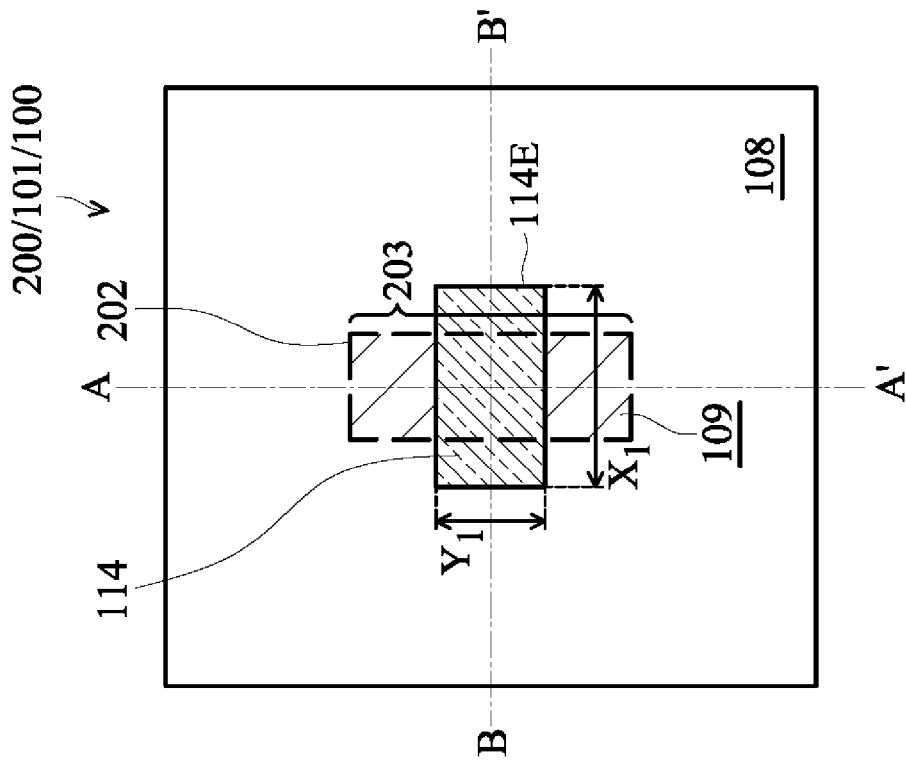
Figure 6C:
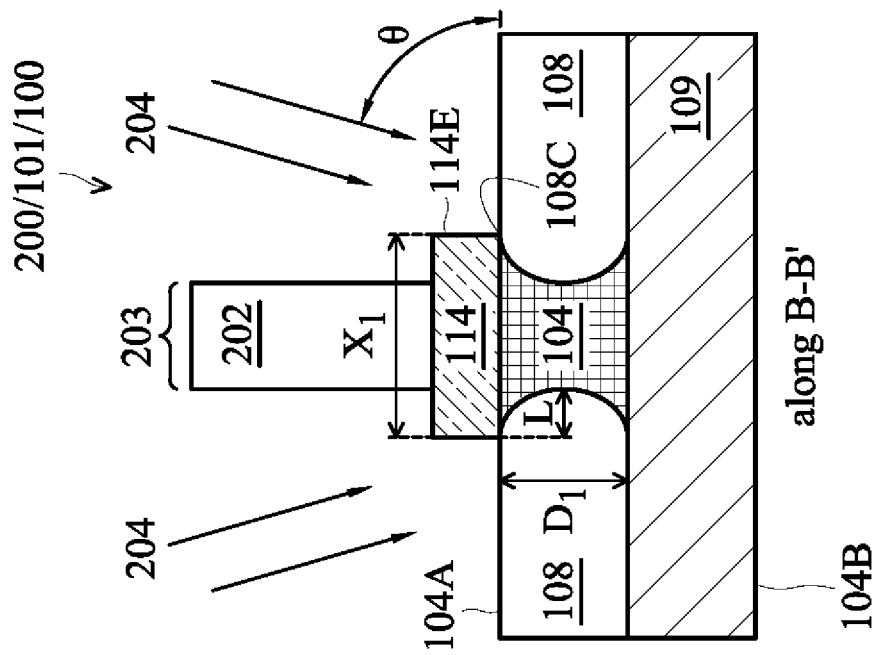
Figure 6B:
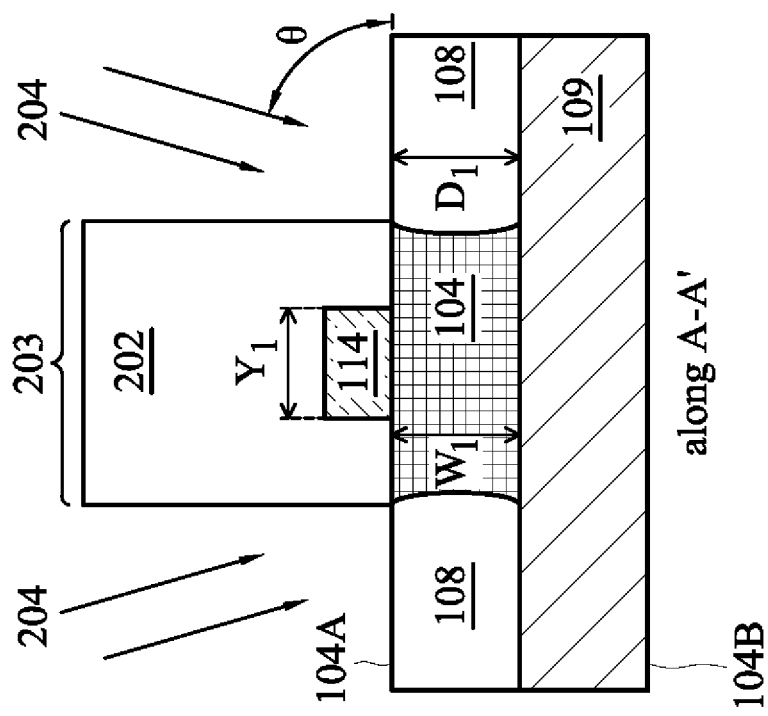

FIG. 6A is a top view of the portion 200 of the pixel region 101 after performing operation 304. FIG. 6B is a cross sectional view of the portion 200 along line A-A' in FIG. 6A. FIG. 6C is the cross sectional view of the portion 200 along line B-B' in FIG. 6A. Referring to FIGS. 6B and 6C, a plurality of dopants 204 is implanted into the portion 200 of the pixel region 101 not covered by the mask layer 202 to form doped isolation features 108. The plurality of dopants has the first conductivity type as the isolation well region 109. Doped isolation features 108 are formed to surround the active area 203 of the source-follower transistor 114 covered by the mask layer 202. In the depicted embodiment, doped isolation feature 108 is a p-type doped region. P-type dopants of the doped isolation feature 108 include boron (B), BF$_2$, gallium, indium, other suitable p-type dopants or combination thereof. A dosage used for the dopants is from about $2 \times 10^{12}$ to about $8 \times 10^{12}$ atoms/cm$^3$. The implantation is performed with a tilt angle θ, between a plane parallel to the front surface 104A and an incident beam of the implantation, from about 75 to about 90 degrees. Each of the doped isolation features 108 has a depth $D_1$ extending form the front surface 104A into the substrate 104. The depth $D_1$ is in a range of about 1000 Å to about 3000 Å. The depth $D_1$ of doped isolation features 108 is substantially equal to the distance $W_1$ of the isolation well region 109 to the front surface 104A of the substrate 104. The doped isolation features 108 and the isolation well regions 109 surround the active area 203 of the source-follower transistor 114 and also surround the light-sensing region 106A of the photodetector 106 (shown in FIGS. 2A and 2C). The possible horizontal leakage paths between the photodetector 106 and the source-follower transistor 114 may be eliminated. When the depth $D_1$ is less than 1000 Å, the doped isolation feature 108 could not electrically isolate various regions. Hence, the device performance of the image sensor device 100 may reduce. When the depth $D_1$ is larger than 3000 Å, the mask layer 202 does not effectively protect the underlying e gate stack 114 from damage during the high energy implantation process to achieve the depth $D_1$.

Due to the implantation is performed with the tilt angle θ, the doped isolation feature 108 may extends under the gate stack 114 along the first axis (along line B-B') with a length L form an edge 114E of the gate stack 114 as shown in FIG. 6C. The gate stack 114 is over a portion of the doped isolation feature 108 with the length L. The length L is less than about 0.1 μm. A profile of the doped isolation feature 108 has a convex portion from the edge 114E of the gate stack 114 along the first axis (along line B-B'). Also, a top corner 108C of the profile is aligned with the edge 114E of the gate stack 114. When the tilt angle θ is larger than 90 degrees, the gate stack 114 does not overlie a portion of the doped feature 108. Edge portions of the gate stack 114 may not be well isolated, and the device performance of the image sensor device 100 may not be well controlled. In some situations, there is a current leakage path along the edge 114E (along the second axis line A-A' direction) of the gate stack 114 which may lead to a short circuit between the later formed source/drain regions during the operation of the image sensor device 100. When the tilt angle θ is less than 75 degrees, the doped isolation feature 108 may extend too much under the gate stack 114 and the channel width $X_2$ will be shortened and the device performance will be affected. In some embodiments, the doped isolation feature 108 is an n-type doped region including n-type dopants such as phosphorus, arsenic, other suitable n-type dopants or combination thereof.

Referring back to FIG. 3, the method 300 continues with operation 305 in which source/drain regions are formed on opposite sides of the gate stack in the substrate. The source/drain regions have a second conductivity type opposite to the first conductivity type. In the depicted embodiment, the second conductivity type is an n-type polarity. Alternatively, the second conductivity type is a p-type polarity.

Figure 7B:
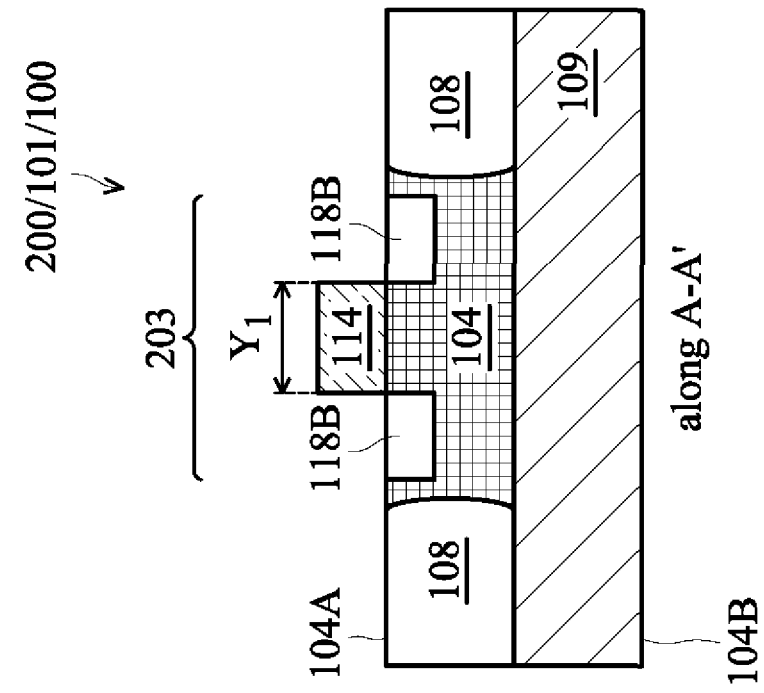
Figure 7A:
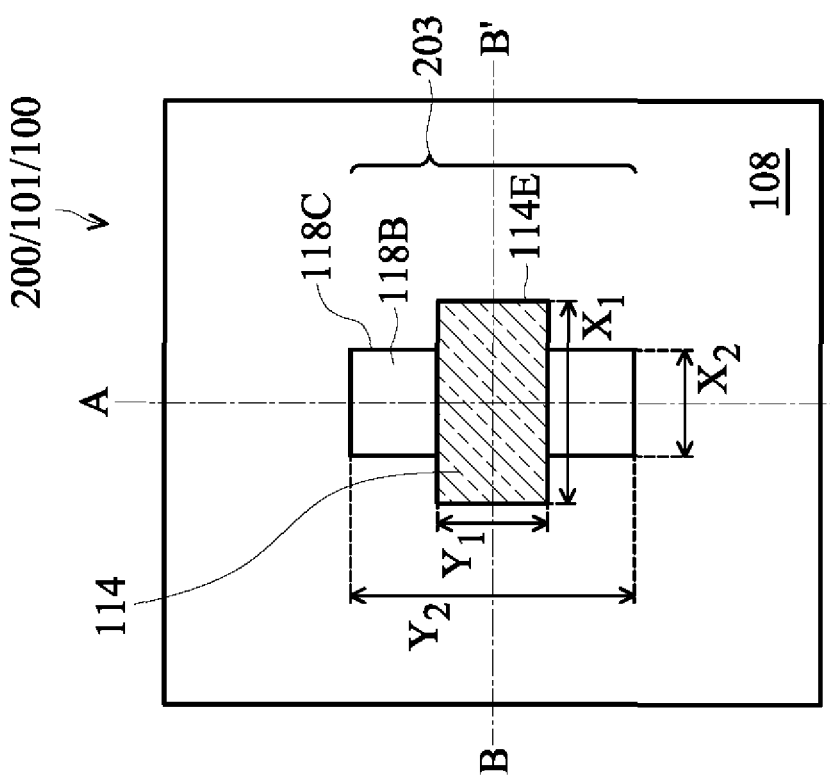

FIG. 7A is a top view of the portion 200 of the pixel region 101 after performing operation 305. FIG. 7B is a cross sectional view of the portion 200 along line A-A' in FIG. 7A. Source/drain regions 118B are formed on opposite sides of the gate stack 114 above the isolation well region 109 on the substrate 104. The source/drain regions 118B have the length $X_2$ along the first axis (along line B-B'). The length $X_2$ of the source/drain regions 118B is defined as the channel width of the source-follower transistor 114. As mentioned in previous paragraph, the mask layer 202 defines the active area 203 and the source/drain regions 118B are confined with the active area 203. The length $X_2$ of the active area 203 is not greater than the length $X_1$ of the gate stack 114 along the first axis (along line B-B'). As shown in FIG. 7A, edges 118C of the source/drain regions 118B do not protrude over edges 114E of the gate stack 114 along the first axis (along line B-B').

With this configuration, the leakage current path will not go from drain region along the edge 114E of the gate stack 114 to source region during the operation of the image sensor device 100. This configuration prevents the image sensor device 100 from electrical short. Hence, the current between the source/drain regions 118B is confined within the gate width (channel width) $X_2$ along the second axis (along line A-A'). The device performance may be accurately controlled.

The source/drain regions 118B have a second conductivity type opposite to the first conductivity type of the doped isolation feature 108 and the isolation well region 109. Also, the floating diffusion region 120 in FIG. 2A has the second conductivity type to be configured as one of source/drain regions for transfer transistor 110 and the reset transistor 112. In the depicted embodiment, the transistor 114 is a NMOS transistor. Source/drain regions 118B are n-type doped regions. N-type dopants of the source/drain regions 118B include phosphorus, arsenic, other suitable n-type dopants or combination thereof. Alternatively, the transistor 114 is a PMOS transistor. Source/drain regions 118B are p-type doped regions. P-type dopants of the source/drain regions 118B include boron (B), $BF_2$, gallium, other suitable p-type dopants or combination thereof.

It is understood that additional steps can be provided before, during, and after the operation 305 of the method 300. For example, as shown in FIG. 2C. The image sensor device 100 further includes a photodetector 106, such as a photodiode, that includes a light-sensing region 106A and a pinned layer 106B. The light-sensing region 106A is a doped region having the second conductivity type of dopants formed in the substrate 104, specifically along the front surface 104A of the substrate 104. The second conductivity type of the light-sensing region 106A is opposite to the first conductivity type of the doped isolation feature 108 and the isolation well region 109. In the depicted embodiment, the light-sensing region 106A is an n-type doped region. The pinned layer 106B is a doped layer overlapping the light-sensing region 106A at the front surface 104A of the substrate 104. The pinned layer 106 has a conductivity type of dopants opposite to the light-sensing region 106A. In the depicted embodiment, the pinned layer 106B is a p-type implanted layer. The photodetector 106 is surrounded by the doped isolation feature 108 and the isolation well region 109.

The image sensor device 100 further includes a multilayer interconnect (MLI) 128 disposed over the front surface 104A of the substrate 104. The MLI 128 includes various conductive features 132 and 130, which may be vertical interconnects, such as contacts and/or vias 130, and horizontal interconnects, such as lines 132. The conductive features 130 and 132 are formed by suitable process, including deposition, lithography patterning, and etching processes to form vertical and horizontal interconnects.

The various conductive features 130 and 132 of the MLI 128 are disposed in an interlayer dielectric (ILD) layer 134. The ILD layer 134 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, low-k dielectric material, or combinations thereof. The ILD layer 134 may be formed by suitable process, including spin-on coating, chemical vapor deposition (CVD) or plasma enhanced chemical vapor deposition (PECVD). In one example, the MLI 128 and the ILD layer 134 may be formed in an integrated process including a damascene process.

In some embodiments, further process steps are included after the MLI 128 formation. As illustrated in FIG. 2C, a carrier wafer 136 is bonded to the MLI 128. The carrier wafer 136 provides mechanical strength and support for processing the back surface 104B of the substrate 104. A planarization process, such as a chemical mechanical polishing (CMP) process, is applied to the back surface 104B of the substrate 104 to reduce a thickness of the substrate 104. A doped layer 138 is formed by an implantation process, diffusion process, annealing process or combinations thereof through the back surface 104B. An antireflective layer 140, a color filter 142 and a lens 144 disposed over the back surface 104B of the substrate 104. The color filter 142 and the lens 144 are aligned with the light-sensing region 106A of the photodetector 106.

In the above depicted embodiments, image sensor device 100 includes a p-type doped substrate 104. Various doping configurations for various features, such as the light-sensing regions 106A, the doped isolation feature 108, the isolation well region 109 and the floating diffusion region 120, described above should be read consistent with the formation of the image sensor device 100 with a p-type doped substrate. Alternatively, image sensor device 100 may include an n-type doped substrate 104 or an n-type material in the substrate 104. Various doping configurations for various features described above should be read consistent with the formation of the image sensor device 100 with an n-type doped substrate.

Various embodiments of the present disclosure may be used to improve the performance of an image sensor device. For example, the doped isolation feature 108 is formed in the pixel region 101 by implantation processes. This disclosure eliminates the drawbacks in conventional methods with etching damages during the shallow trench isolation (STI) formation in the pixel region. Without etching damages, this disclosure could reduce dark current or reduce white pixel defects of the image sensor device. In another example, the gate stack 114 is formed before the implantation process for forming the doped isolation feature 108. The gate stack 114 provides a physical feature with a sharp edge for a better lithography alignment in the mask layer 202 formation. The alignment of mask layer 202 provides an accurate control of the overlay between the gate stack 114 and later formed doped isolation feature 108. The implantation for the doped isolation feature 108 is performed with a tilt angle θ. The doped isolation feature 108 may extends under the gate stack 114 along the first axis (along line B-B') with a length L form the edge 114E of the gate stack 114. A possible current leakage path along the edge 114 of the gate stack 114 from the drain region to the source region is eliminated. The short between source/drain regions 118B is prevented.

One aspect of the disclosure describes a method of forming an image sensor device. An isolation well is formed in a pixel region of a substrate. The isolation well has a first conductivity type. A gate stack is formed over the isolation well on the substrate. A mask layer is formed over the isolation well and covering at least a majority portion of the gate stack. A plurality of dopants is implanted in the pixel region not covered by the mask layer to form doped isolation features surrounding an active region. The gate stack is disposed on the active region. The plurality of dopants has the first conductivity type. A source region and a drain region are formed on opposite sides of the gate stack in the substrate. The source region and the drain region have a second conductivity type opposite to the first conductivity type.

A further aspect of the disclosure describes a method of forming an image sensor device. A pixel region has a front surface in a substrate. The front surface is defined by a first axis and a second axis perpendicular to the first axis. A gate stack is formed along the first axis on the front surface in the pixel region. The gate stack has a length $X_1$ along the first axis and a second length $Y_1$ along the second axis. A mask layer is formed over at least a majority portion of the gate stack and a portion of the front surface to define an active area. A plurality of dopants is implanted with a tilt angle θ into the substrate not covered by the mask layer to form doped isolation features in the pixel region. The doped isolation features surrounds the gate stack and the active area.

The present disclosure also describes an image sensor device. The image sensor device includes a substrate having a first surface. An isolation well region is disposed within the substrate. The isolation well region is under the first surface with a distance $W_1$. A gate stack is disposed over the isolation well region on the first surface of the substrate. The gate stack has an edge. A doped isolation feature is disposed within the substrate and surrounding an active region. The gate stack is disposed on the active region. The doped isolation feature has a top corner aligned with the edge of the gate stack and extends from the edge of the gate stack under the gate stack with a length L.

Another aspect of this disclosure relates to an image sensor device that comprises an isolation well region within a substrate. The image sensor device also comprises a gate stack over the isolation well region on the first surface of the substrate. The gate stack has an edge. The image sensor device further comprises a doped isolation feature within the substrate between the isolation well region and the gate stack. The doped isolation feature surrounds an active area. The gate stack is over the active area. The doped isolation feature extends from the edge of the gate stack under the gate stack.

Another aspect of this description relates to an image sensor device that comprises a gate stack over a pixel region of a substrate. The pixel region has a front surface defined by a first axis and a second axis perpendicular to the first axis. The gate stack has a length along the first axis and a second length along the second axis. The image sensor also comprises a mask layer over the gate stack and the front surface. The image sensor further comprises a doped isolation feature within the substrate. The doped isolation feature has a convex portion under the gate stack.

A further aspect of this description relates to an image sensor device that comprises a substrate having a first surface. The image sensor device also comprises an isolation well region within the substrate and under the first surface. The image sensor device further comprises a gate stack over the isolation well region on the first surface of the substrate. The gate stack has an edge. The image sensor device additionally comprises a doped isolation feature within the substrate and surrounding an active area. The gate stack is over the active area. The doped isolation feature has a top corner aligned with the edge of the gate stack. The doped isolation feature extends from the edge of the gate stack under the gate stack.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed:

1. An image sensor device, comprising:
   an isolation well region within a substrate at a position that is vertically overlapping and laterally offset from a photodetector;
   a gate stack over the isolation well region on a first surface of the substrate, the gate stack having an edge; and
   a doped isolation feature within the substrate between the isolation well region and the gate stack, the doped isolation feature surrounding an active area;
   wherein the gate stack is vertically over the active area, and the doped isolation feature extends from the edge of the gate stack under the gate stack.

2. The image sensor device of claim 1, wherein the doped isolation feature has a convex portion under the gate stack.

3. The image sensor device of claim 1, the isolation well region and the doped isolation feature have a same conductivity type.

4. The image sensor device of claim 1, wherein the doped isolation feature extends from an edge of the gate stack under the gate stack by a length less than about 0.1 μm.

5. The image sensor device of claim 1, wherein the isolation well region is under a front surface of the substrate by a distance, the doped isolation feature has a depth into the substrate, and the distance is substantially equal to the depth.

6. The image sensor device of claim 1, further comprising:
   a source region in the active area on a first side of the gate stack; and
   a drain region in the active area on a second side of the gate stack opposite the first side.

7. An image sensor device, comprising:
   a gate stack onto a front surface of a substrate over a pixel region of the substrate, the pixel region defined by a first axis and a second axis perpendicular to the first axis, the gate stack having a length along the first axis and a second length along the second axis; and
   a doped isolation feature within the substrate, wherein the doped isolation feature has a convex portion under the gate stack and wherein the doped isolation feature continually extends along the front surface of the substrate from a first position adjacent to the gate stack to a second position below the gate stack.

8. The image sensor device of claim 7, further comprising:
   an isolation well region within the substrate,
   wherein the doped isolation feature is within the substrate between the isolation well region and the gate stack.

9. The image sensor device of claim 8, the isolation well region and the doped isolation feature have a same conductivity type.

10. The image sensor device of claim 8, wherein the isolation well region is under the front surface of the substrate by a distance, the doped isolation feature has a depth into the substrate, and the distance is substantially equal to the depth.

11. The image sensor device of claim 7, wherein the doped isolation feature extends from an edge of the gate stack under the gate stack by a length less than about 0.1 μm.

12. An image sensor device, comprising:
    a substrate having a first surface;
    an isolation well region within the substrate and under the first surface;
    a gate stack over the isolation well region on the first surface of the substrate, the gate stack having an edge;
    a doped isolation feature within the substrate and surrounding an active area, wherein the doped isolation feature has a planar upper surface; and
    wherein the gate stack is over the active area, the doped isolation feature has a top corner aligned with the edge of the gate stack, and the doped isolation feature extends from the edge of the gate stack under the gate stack.

13. The image sensor device of claim 12, the isolation well region and the doped isolation feature have a same conductivity type.

14. The image sensor device of claim 12, wherein the doped isolation feature extends from an edge of the gate stack under the gate stack by a length less than about 0.1 μm.

15. The image sensor device of claim 12, further comprising a mask layer over the gate stack.

16. The image sensor device of claim 12, wherein the isolation well region is under a front surface of the substrate by a distance, the doped isolation feature has a depth into the substrate, and the distance is substantially equal to the depth.

17. The image sensor device of claim 1, further comprising:
    a doped layer disposed on a second surface of the substrate opposite the first surface of the substrate, wherein the isolation well region separates the doped isolation feature from the doped layer.

18. The image sensor device of claim 7, wherein the doped isolation feature does not contact a shallow trench isolation (STI) region filled with a dielectric material.

19. The image sensor device of claim 7, wherein a shallow trench isolation (STI) region filled with a dielectric material is not arranged between the doped isolation feature and an upper surface of the substrate.

20. The image sensor device of claim 12, wherein the doped isolation feature continually extends along the first surface of the substrate from a first position adjacent to the gate stack to a second position below the gate stack.

* * * * *